United States Patent [19]

Totsuka et al.

[11] Patent Number: 4,920,036

[45] Date of Patent: Apr. 24, 1990

[54] PHOTOSENSITIVE RECORDING ELEMENT HAVING PIGMENTED PHOTOPOLYMER LAYER

[75] Inventors: Mikio Totsuka; Fumiaki Shinozaki; Yuichi Wakata; Tomizo Namiki, all of Fujinomiya, Japan

[73] Assignee: Fuji Photo Film Co., Ltd., Minami-ashigara, Japan

[21] Appl. No.: 404,068

[22] Filed: Sep. 7, 1989

Related U.S. Application Data

[63] Continuation of Ser. No. 211,147, Jun. 22, 1988, abandoned, which is a continuation of Ser. No. 908,732, Sep. 18, 1986, abandoned.

[30] Foreign Application Priority Data

Sep. 20, 1985 [JP] Japan .................................. 60-207979

[51] Int. Cl.$^5$ .............................................. G03C 1/76
[52] U.S. Cl. .................................... 430/270; 430/175; 430/271; 430/281; 430/286; 430/518
[58] Field of Search ............... 430/175, 270, 271, 281, 430/286, 518

[56] References Cited

U.S. PATENT DOCUMENTS

| | | | |
|---|---|---|---|
| 3,788,855 | 1/1978 | Cohen et al. | 430/518 |
| 3,898,088 | 8/1975 | Cohen et al. | 430/518 |
| 3,948,663 | 4/1976 | Shiba et al. | 430/518 |
| 4,247,615 | 1/1981 | McGuckin et al. | 430/145 |
| 4,312,940 | 1/1982 | Nakamura et al. | 430/518 |
| 4,379,838 | 4/1983 | Helling et al. | 430/518 |
| 4,427,759 | 1/1984 | Gruetzmacher | 430/281 |
| 4,542,088 | 9/1985 | Kojima et al. | 430/281 |
| 4,544,621 | 10/1985 | Roth | 430/281 |
| 4,808,510 | 2/1989 | Snow et al. | 430/281 |

*Primary Examiner*—Jack P. Brammer
*Attorney, Agent, or Firm*—Sixbey, Friedman, Leedom & Ferguson

[57] ABSTRACT

A photosensitive recording material employable in a printing art, etc. comprising a support, an intermediate layer, and a photosensitive resin layer which comprises a pigment, superposed in this order, which is characterized in that said pigment has an anionic group and said photosensitive resin layer contains a compound having a cationic group.

3 Claims, No Drawings

PHOTOSENSITIVE RECORDING ELEMENT HAVING PIGMENTED PHOTOPOLYMER LAYER

This application is a continuation of Ser. No. 211,147 filed June 22, 1988 now abandoned, which itself was a continuation of application Ser. No. 908,732 filed Sept. 18, 1986, now abandoned.

BACKGROUND OF THE INVENTION

1. Field of the invention

The present invention relates to a photosensitive recording material using a photosensitive resin which is employed in various arts such as a printing art.

2. Description of prior arts

A photosensitive recording material comprises a layer of photosensitive resin (photopolymer). Since the photosensitive resin varies in its molecular structure by exposure to light or the like so that the photosensitive resin is made soluble or insoluble in a solvent, a visible image (pattern) can be formed on the photosensitive recording material by utilizing said phenomenon. Accordingly, the photosensitve recording material has been used widely as a printing plate (e.g., a PS lithograph, a resin relief plate, etc.), a photo resist (e.g., a dry film resist), a prepress proof and and a "dot to dot work" lith-type film according to the purpose in various fields involving a photography and a printing art in which a visible image is required, and a plate processing art.

For instance, a photosensitive recording material used for color proofing to foresee clolor condition, color tone, etc. of the finished printing takes a structure comprising a support (hereinafter also referred to as a temporary support), an intermediate layer of an organic polymer and a photosensitive resin layer, superposed in this order. In concrete, in the case of using the photosensitive recording material as an image-forming material (i.e., photosensitive transfer sheet) in a surprint process, a separation image is formed on the intermediate layer (peel layer) of the recording material through exposure and development, and the separation image is transferred onto an optionally chosen support to prepare a color proofing sheet having the separation image.

The color proofing sheet is used for checking the color of finished printing when the color proofing is actually performed, so that the hue of the separation image formed on the photosensitive recording material (color image-forming material) is desired to be as sharp as possible.

For obtaining a colored image on the photosensitive recording material, there has been generally carried out a process comprising the steps of mixing an organic pigment having excellent properties in clearness of color, coloring affinity, and a range of hues, and the like, with a photosensitive resin, solvent, etc. to prepare a coating solution, applying the solution onto the aforementioned intermediate layer to obtain a recording material, exposing the recording material, and removing a soluble resin from the resin layer by development (i.e., patterning) with a developing solution. In order to satisfying the wide usage for the photosensitive recording material, a pigment in which a metal is chelated is now paid much attention because said pigment is favorable in the above-mentioned various properties.

The metal-chelated pigment is insoluble (i.e., stable) in the above-mentioned coating solution, because the pigment has an anionic group (e.g., a carboxylic acid group or a sulfonic acid group) as a substituent in its molecule, and has a chelated monovalent or divalent metal ion such as sodium or potassium to form a metal salt. Therefore, when a photosensitive resin layer is formed using such pigment, other layer (intermediate layer) is prevented from being colored, whereby an image having sharp hues can be obtained.

However, in some cases, the chelation of the metal ion in the pigment is not completely formed, and a portion of a pigment is free from the chelation. The free pigment is soluble in the coating solution. Accordingly, when a photosensitive resin layer is formed using the coating solution containing such soluble pigment, the pigment tends to permeate the intermediate layer together with the solvent in the stage of applying the solution onto the intermediate layer. As a result, the intermediate layer is likely stained with the pigment. Thus, so-called color-fogging is produced on the intermediate layer.

SUMMARY OF THE INVENTION

It is an object of the present invention to provide a photosensitive recording material which is substantially free from coloring of the intermediate layer, that is, free from so-called color-fogging.

It is another object of the invention to provide a photosensitive recording material capable of forming an image of high sharpness thereon through reduction of the color-fogging.

There is provided by this invention an improvement in a photosensitive recording material comprising a support, an intermediate layer, and a photosensitive resin layer containing a pigment, superposed in this order, wherein said pigment has an anionic group and said photosensitive resin layer contains a compound having a cationic group.

According to the present invention, the photosensitive resin layer of the photosensitive recording material is incorporated with a compound having a cationic group such as a polymer containing a quaternary ammonium salt group or a phosphonium salt group in combination with a pigment having an anionic group such as a carboxylic acid group or a sulfonic acid group, whereby the intermediate layer is substantially prevented from coloring in the stage of forming the photosensitive resing layer, and the image-forming properties on the recording material is highly enhanced.

In more detail, a compound having a cationic group such as a polymer containing a quaternary ammonium salt group or a phosphonium salt group incorporated into the coating solution for the preparation of a photosensitive resin layer draws a soluble pigment which has an anionic group such as a carboxylic acid group or sulfonic acid group but does not form a chleated compound and hence keeps the soluble pigment in the photosensitive resin layer. As a result, coloring of the intermediate layer with the soluble pigment, that is, permeation of pigment together with the solvent into the intermediate layer, is restrained in the stage of applying the coating solution onto the intermediate layer to form a photosensitive resin layer thereon, and the color-fogging caused by the pigment can be effectively prevented.

Further, since the color-fogging of the intermediate layer can be effectively reduced in the photosensitive recording material of the present invention, an image of high sharpness can be obtained using such recording material. Particularly, the recording material of the invention is very advantageous in the case of forming a color image on a color-proofing sheet through the surprint process.

DETAILED DESCRIPTION OF THE INVENTION

The photosensitive recording material of the present invention essentially comprises a support, an intermediate layer and a photosensitive resin layer, superposed in this order. The photosensitive recording material of the invention can be prepared, for instance, by the process using the following materials.

The support material employable in the invention is chemically and thermally stable and is flexibile. The support may be light-transmissive if necessary. Examples of the support material include polyesters such as polyethylene terephthalate, polycarbonate, cellulose derivatives such as cellulose acetate, halogenated polymers such as polyvinyl chloride, and polyolefins such as polystyrene and polypropylene. These polymers and other employable polymers are described, for instance, in Japanese Patent Provisional Publication No. 47(1972)-41830, No. 48(1973)-9337 and No. 51(1976)-5101. Preferred are polyethylene terephthalate, polycarbonate and these heat-treated materials.

On the reverse side of the support, namely, the side on which the intermediate layer is not formed, a backing layer of a polymer material such as polyvinyl butyral, vinyl chloride-vinyl acetate copolymer, or cellulose acetate can be provided for the purpose of enhancing the workability. The backing layer can contain known additives such as a matting agent.

On the support, an intermediate layer is formed. A material employable for the intermediate layer can be appropriately selected from those employed conventionally. Examples of the materials include an alcohol-soluble polyamide, hydroxystyrene-type polymers, polyvinyl acetate, poly(meth)acrylate, polyvinyl chloride, polyvinyl butyrate, methylmethacrylate-acrylate copolymers, cellulose acetate butyrate, vinyl chloride-vinyl acetate copolymers, cellulose diacetate, cellulose triacetate, polyvinyl aclohol, and a mixture of a partially esterified styrene-maleic anhydride copolymer and methoxymethyl nylon. Preferred is a mixture of an alcohol-soluble polyamide and a hydroxystyrene-type polymer.

The intermediate layer can be formed on the support by a process comprising the steps of dissolving the above-mentioned material in an appropriate solvent to prepare a coating solution, then applying the coating solution onto the support, and drying. The coating solution may contain a surfactant for improving the surface condition of the formed layer. A fluorine atom-containing surfactant is particularly preferred.

The intermediate layer has a thickness generally in the range of 0.1 to 20 μm, preferably in the range of 0.2 to 5 μm, more preferably in the range of 0.3 to 3 μm.

On the intermediate layer is then provided a photosensitive resin layer.

The photosensitive resin employable for the photosensitive resin layer can be chosen from those conventionally employed. Preferred is a photosensitive resin developable with an alkaline solution. For example, in the case that a photosensitive resin layer of "negative to positive type" is prepared, a blended composition comprising an azide-type photosensitive agent such as 2,6-di(4'-azidebenzal)cyclonexane and phenol-novolak resin, and a blended composition comprising a binder of benzyl methacrylate-methacrylic acid copolymer, a polyfunctional monomer such as trimethylolpropane triacrylate, and a photopolymerization initiator such as Michlers' ketone are preferred. A photosensitive resin layer of "positive to positive type" preferably utilizes a quinonediazidetype photosensitive agent such as o-quinonediazide.

The pigment having an anionic group which is contained in the photosensitive resin layer preferably is a compound having at least one group selected from those consiting of a carboxylic acid group (i.e., carboxyl group) and a sulfonic acid group (sulfo group). Examples of such pigment include a compound having the formula (I):

$$[A-N=N-B]^{n-} M^{n+} \quad (I)$$

wherein A is

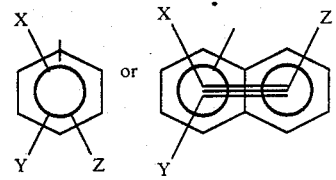

wherein each of X, Y and Z is any one of a carboxylic acid agroup, a sufonic acid group, an alkyl group having 1-12 carbon atoms, an alkoxyl group having 1-12 carbon atoms, a nitro group, a halogen atom and a hydrogen atom;

B is

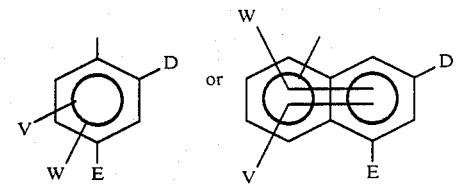

wherein each of V and W is any one of a carboxylic acid group, a sulfonic acid group and a hydrogen atom; and each of D and E is a hydrogen atom or a hydroxyl group and at least one of D and E is a hydroxyl group; and at least one of X, Y, Z, V and W is a carboxylic acid group or a sulfonic acid group;

M is a metal atom; and n is an integer of from 1 to 5.

The substituents expressed by X, Y, Z, V and W can take positions at any optional sites on the above-described ring structures.

The pigment having the above formula (I) is a compoud in which at least one of A and B, both constituting the formula (I), has at least one carboxylic acid group or one sulfonic acid group.

In the case that each of X, Y and Z is a halogen atom in the formula (I), the halogen atom means any one of F, Cl, Br and I.

As concrete examples of the pigment having the formula (I), there can be mentioned the following compounds.

(1) Pigment Red 48 (C.I 15865) having the formula:

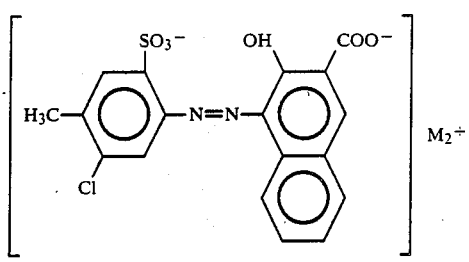

wherein M is Na;
(2) Pigment Red 48 (C.I 15865) having the formula:

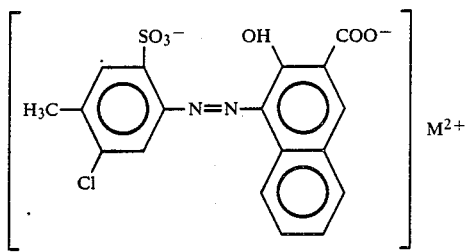

wherein M is any one of Ca, Ba, Sr and Mn;
(3) Pigment Red 49 (C.I 15630) having the formula:

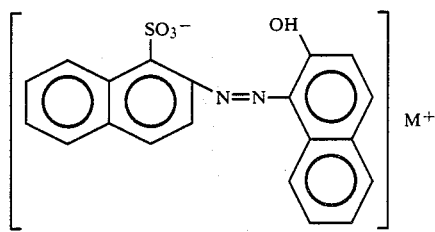

wherein M is Na;
(4) Pigment Red 49 (C.I 15630) having the formula:

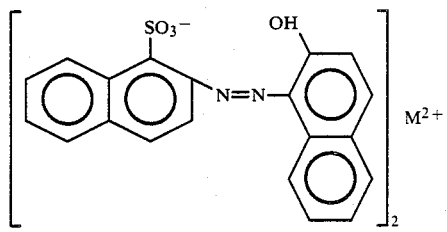

wherein M is any one of Ca and Ba;
(5) Pigment Red 50 (C.I 15500) having the formula:

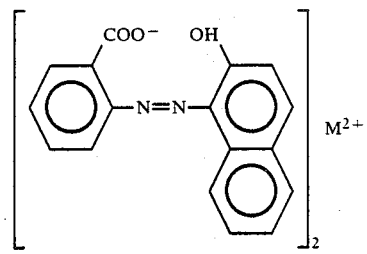

wherein M is Ba;
(6) Pigment Red 51 (C.I 15580) having the formula:

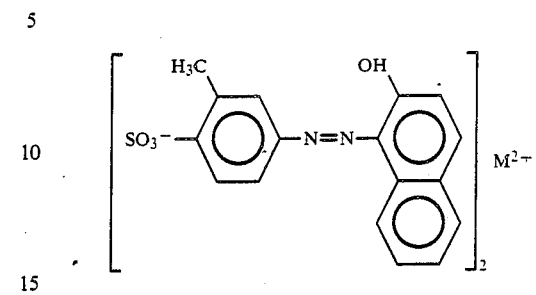

wherein M is Ba;
(7) Pigment Red 52 (C.I 15860) having the formula:

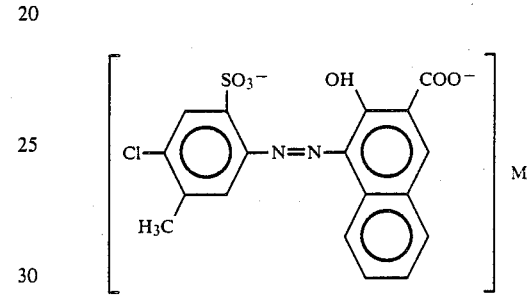

wherein M is Mn;
(8) Pigment Red 53 (C.I 15585) having the formula:

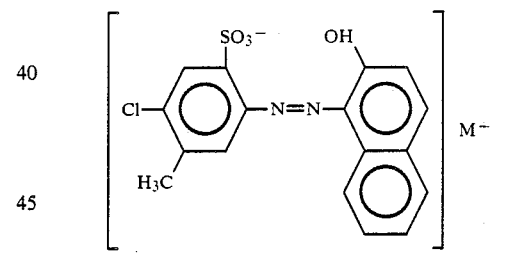

wherein M is Na;
(9) Pigment Red 53 (C.I 15585) having the formula:

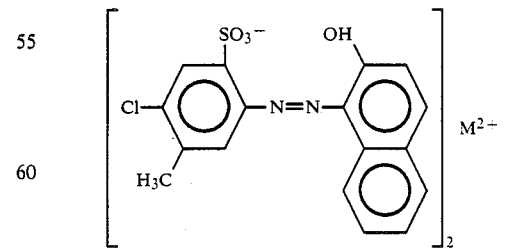

wherein M is Ba;
(10) Pigment Red 54 (C.I 14830) having the formula:

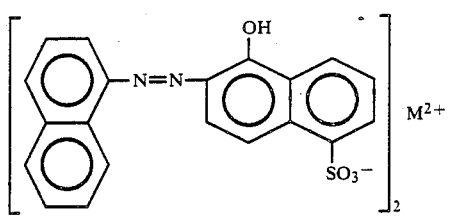

wherein M is Ca;

(11) Pigment Red 55 (C.I 15820) having the formula:

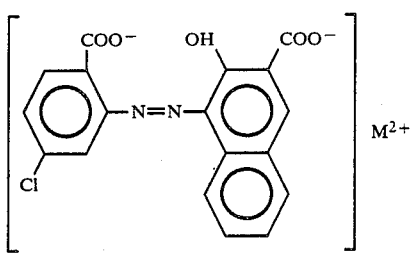

wherein M is Mn;

(12) Pigment Red 57 (C.I 15850) having the formula:

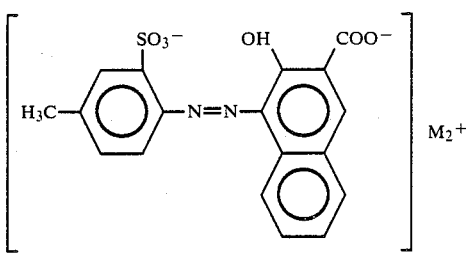

wherein M is Na;

(13) Pigment Red 57 (C.I 15850) having the formula:

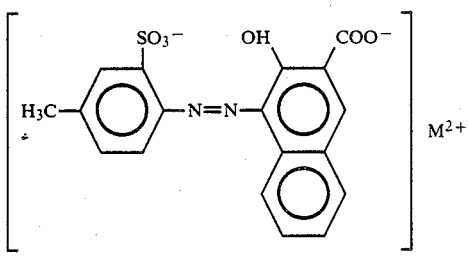

wherein M is Ca;

(14) Pigment Red 58 (C.I 15825) having the formula:

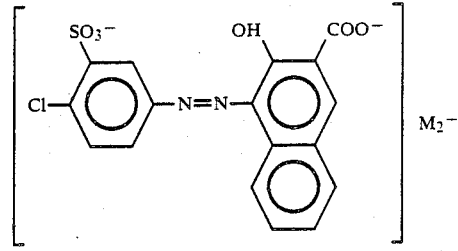

wherein M is Na;

(15) Pigment Red 58 (C.I 15825) having the formula:

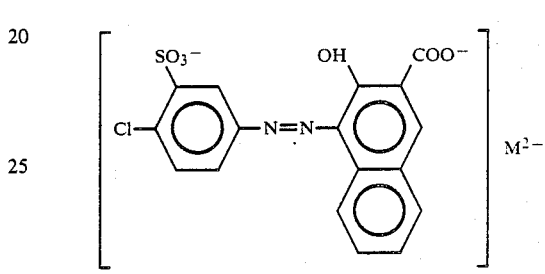

wherein M is any one of Ca and Mn;

(16) Pigment Red 60 (C.I 16015) having the formula:

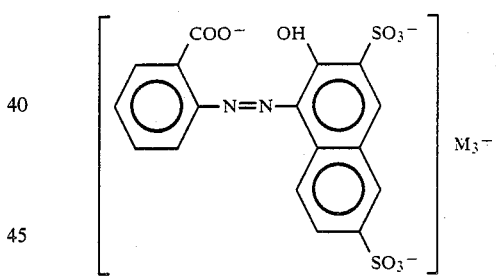

wherein M is Na;

(17) Pigment Red 63 (C.I 15880) having the formula:

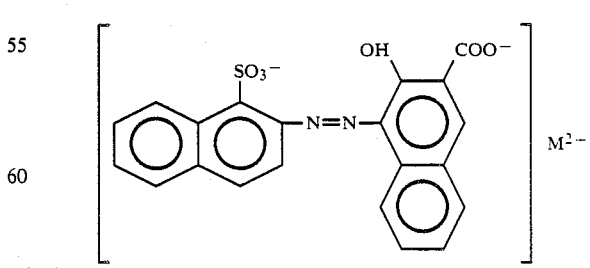

wherein M is any one of Ca, Ba and Mn;

(18) Pigment Red 64 (C.I 15800) having the formula:

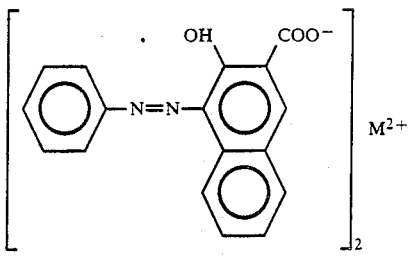

wherein M is Ca; and

(19) Pigment Red 68 (C.I 15525) having the formula:

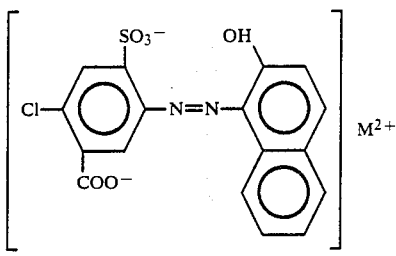

wherein M is Ca.

The amount of the pigment contained in the photosensitive resin layer varies depending upon the kind or size of the pigment employed. The amount is generally in the range of 1-30% by weight, preferably in the range of 2-10% by weight, based on the solid component of the photosensitive resin layer.

The photosensitive resin layer also contains a compound having a cationic group which is a characteristic requisite of the present invention. Examples of the compound having a cationic group include a compound having the formula (II):

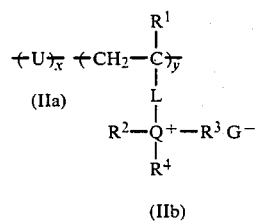

wherein U is an ethylenic unsaturated monomer; L is a divalent group having 1-12 carbon atoms; Q is a nitrogen atom or a phosphorous atom; $R^1$ is a hydrogen atom or an alkyl group having 1-6 carbon atoms; each of $R^2$, $R^3$ and $R^4$ independently is an alkyl group having 1-12 carbon atoms or an aralkyl group having 7-20 carbon atoms; $G^-$ is a monovalent anion; x is a number in the range of 0-90 molar %; and y is a number in the range of 10-100 molar %.

The compound having the formula (II) has a repeating unit consisting of (IIa) and (IIb), and is any one of a polymer in which these repeating units are regularly arranged, a block polymer or a random polymer.

Examples of the ethylenic unsaturated monomer expressed by U in the formula (II) include olefins such as ethylene, propylene, 1-butene, vinyl chloride, vinylidene chloride, isobutene and vinyl bromide; diolefins such as butadiene, isoprene and chloroprene; ethylenic unsaturated esters of aliphatic acid or aromatic carboxylic acid such as vinyl acetate, allyl acetate, vinyl propionate, vinyl butyrate and vinyl benzoate; esters of ethylenic unsaturated acids such as methyl methacrylate, butyl methacrylate, t-butyl methacrylate, cyclohexyl methacrylate, benzyl methacrylate, phenyl methacrylate, octyl methacrylate, amyl acrylate, 2-ethylhexyl acrylate, benzyl acrylate, dibutyl maleate, diethyl fumarate, ethyl crotonate and dibutyl methylene malonate; styrenes such as styrene, α-methylstyrene, vinyltoluene, chlorostyrene, dichlorostyrene and bromstyrene; and unsaturated nitrile such as acrylonitrile, methacrylonitrile, allyl cyanide and crotone nitrile. Preferred are styrenes and methacrylic acid esters from the viewpoints of easiness of emulsion polymerization and hydrophobic nature. The repeating unit expresses by (IIa) may contain two or more kinds of the above-mentioned ethylenic unsaturated monomers.

In the formula (II), $R^1$ is preferably a hydrogen atom or a methyl group from the viewpoints of polymerization reactivity, and the like.

In the formula (II), L is preferably a divalent group having any one of the following formulas.

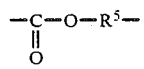

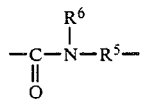

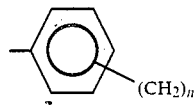

From the viewpoint of alkali resistance, more preferred is a divalent group having any one of the following formulas.

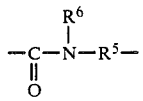

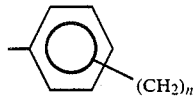

From the viewpoint of easiness of emulsion porimerization, most preferred is a divalent group having the formula.

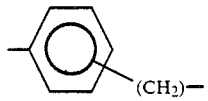

In the above-described formulas, $R^5$ is an alkylene group (e.g., methylene, ethylene, trimethylene and tetramethylene), an arylene group or an aralkylene group; $R^6$ is a hydrogen atom or $R^2$; and n is an integer of 1 or 2. The aralkylene group is, for instance, one having the formula:

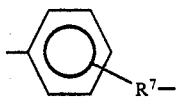

wherein $R^7$ is an alkylene group having 0-6 carbon atoms.

In the formula (II), Q is preferably a nitrogen atom (N) in view of easiness of handling of the starting materials.

$G^-$ is an anion other than iodine ion. Examples of the anion include halogen ion such as chlorine ion and bromine ion; and alkylsulfuric acid ion such as methylsulfuric acid ion and ethylsulfuric acid ion; alkyl- or arylsulfonic acid ion such as methanesulfonic acid ion, ethanesulfonic acid ion, benzenesulfonic acid ion and p-toluenesulfonic acid ion; nitric acid ion; acetic acid ion; and sulfuric acid ion. Preferred are chlorine ion, alkylsulfuric acid ion, arylsulfonic acid ion and nitric acid ion.

Each of $R^2$, $R^3$ and $R^4$ in the formula (II) independently is a substituted or unsubstituted alkyl group, or a substituted or unsubstituted aralkyl group.

Examples of the unsubstituted alkyl group include methyl, ethyl, propyl, isopropyl, t-butyl, hexyl, cyclohexyl, 2-ethyhexyl and dodecyl groups. Examples of the substituted alkyl groups include alkoxyalkyl groups (e.g., methoxymethyl, methoxybutyl, ethoxyethyl, buthoxyethyl and vinyloxyethyl groups), cyanoalkyl groups (e.g., 2-cyanoethyl and 3-cyanopropyl groups), halogenated alkyl groups (e.g., 2-fluoroethyl, 2-chloroethyl and perfluoropropyl groups), alkoxycarbonyl alkyl groups (e.g., ethoxycarbonyl methyl group), allyl groups, 2-butenyl groups, and propargyl groups.

Examples of the unsubstituted aralkyl groups include benzyl group, phenethyl group, diphenylmethyl and naphthylmethyl groups. Examples of the substituted aralkyl groups include alkylaralkyl groups (e.g., 4-methylbenzyl, 2,5-dimethylbenzyl, 4-isopropylbenzyl and 4-octylbenzyl groups), alkoxyaralkyl groups (e.g., 4-methoxybenzyl, 4-pentafluoropropenyloxybenzyl and 4-ethoxybenzyl groups), cyanoaralkyl groups (e.g., 4-cyanobenzyl and 4-(4-cyanophenyl)benzyl groups), and halogenated aralkyl groups (e.g., 4-chlorobenzyl, 3-chlorobenzyl, 4-bromobenzyl and 4-(4-chlorophenyl)benzyl groups).

The alkyl group preferably has 1-12 carbon atoms, and the aralkyl group preferably has 7-14 carbon atoms. $R^2$, $R^3$ and $R^4$ may be the same as, or different from each other. In the case that each of $R^2$, $R^3$ and $R^4$ is an alkyl group, the total of the carbon atoms thereof is preferably 12 or more because the such polymer is soluble in an organic solvent.

$R^2$, $R^3$ and $R^4$ may be combined to each other to form a ring structure in combination with Q. An example of such ring structure is:

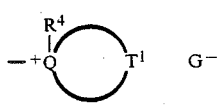

wherein $T^1$ is an atomic group required for forming an aliphatic heterocyclic structure in combination with Q. Examples of the aliphatic heterocyclic structure are:

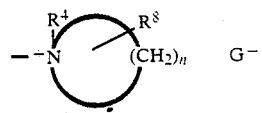

wherein $R^8$ is a hydrogen atom or $R^4$, and n is an integer of from 2 to 12;

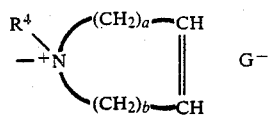

wherein $a+b$ is an integer of from 2 to 7;

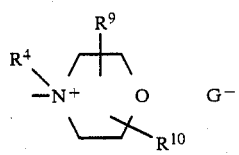

wherein each of $R^9$ and $R^{10}$ is a hydrogen atom or an alkyl group having 1-6 carbon atoms; and

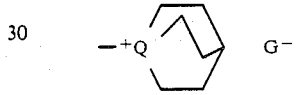

Other examples of the ring structure are as follows:

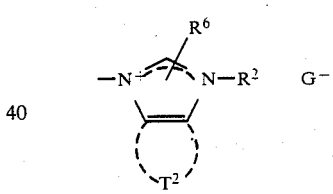

wherein $T^2$ is an atomic group required for forming a benzene ring, or is not contained; and

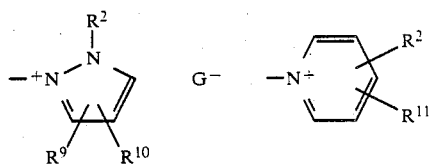

wherein $R^{11}$ is any one of a hydrogen atom, the groups represented by $R^2$,

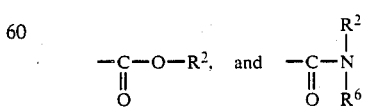

and in the case that $R^{11}$ is substituted with two $R^2$, they may be the same as or different from each other.

Among the above-mentioned examples, preferred are:

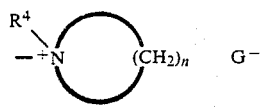

wherein n is an integer of from 4 to 6; and

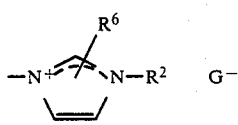

In the formula (II), the repeating unit (IIb) may consist of two or more units.

x and y in the formula (II) preferably are in the range of 20–60 molar % and 40–80 molar %, respectively.

The above-mentioned polymer can be a copolymer with a monomer having at least two ethylenic unsaturated groups. Examples of such monomers include ethylene glycol dimethacrylate, diethylene glycol dimethacrylate, neopentyl glycol dimethacrylate, tetramethylene glycol dimethacrylate, pentaerythritol tetramethacrylate, trimethylolpropane trimethacrylate, ethylene glycol diacrylate, diethylene glycol diacrylate, neopentyl glycol diacrylate, tetramethylene glycol diacrylate, trimethylolpropane triacrylate, allyl methacrylate, allyl acrylate, diallyl phthalate, methylene bisacrylamide, methylene bismethacrylamide, trivinyl cyclohexane, divinyl benzene, N,N-bis(vinylvenzyl)-N,N-dimethyl ammonium chloride, N,N-diethyl-N-(methacryloil oxyethyl)-N-(vinylbenzyl)ammonium chloride, N,N,N',N'-tetraethyl-N,N'-bis(vinylbenzyl)-p-xylylene diammonium dichloride, N,N'-bis(vinylbenzyl)triethylene diammonium dichloride, and N,N,N',N'-tetrabutyl-N,N'-bis(vinylbenzyl)-ethylene diammonium dichloride.

Examples of the polymer expressed by the formula (II) are as follows.

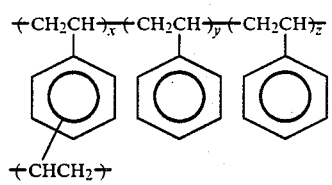
(i)

wherein x:y:z=5:47.5:47.5;

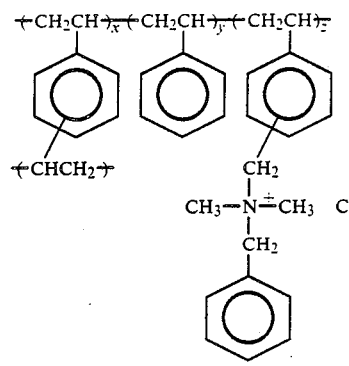
(ii)

wherein x:y:z=10:45:45;

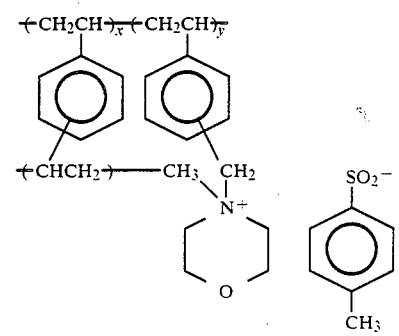
(iii)

wherein x:y=5:95;

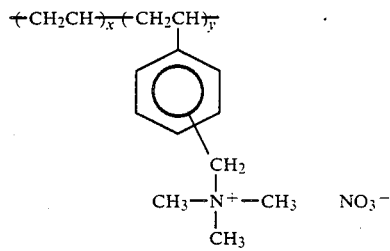
(iv)

wherein x:y=50:50;

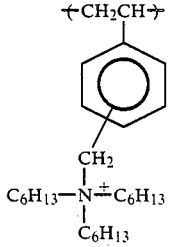
(v)

-continued

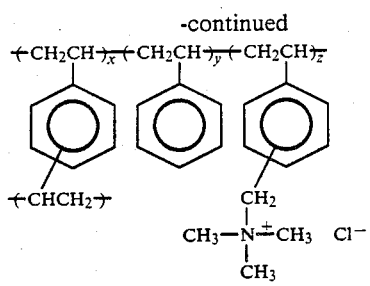

(vi)

wherein x:y:z=10:45:45.

The ratio between the amount of the compound having a cationaic group and the amount of the pigment generally is in the range of 1:99-70:30 (compound:pigment) by weight, preferably in the range of 15:85-50:50 by weight.

The photosensitive resin layer can be prepared, for instance, by a process comprising the steps of dissolving the above-described photosensitive resin, pigment having an anionic group, and compound having a cationic group in an appropriate solvent to prepare a coating solution, then coating the solution onto the intermediate layer, and drying the coated solution. The thickness of the photosensitive resin layer generally ranges from 0.5 to 100 μm, preferably from 1.0 to 50 μm, most preferably from 1.0 to 20 μm.

The materials of the photosensitive resin layer and the process of the preparation thereof are described in detail in various publications such as Japanese Patent Publications No. 46(1971)-15326 and No. 46(1971)-35682, and Japanese Patent Provisional Publications No. 47(1972)-41830, No. 48(1973)-93337, No. 49(1974)-441, No. 51(1976)-5101 and No. 59(1984)-97140.

If the photosensitive resin layer of "negative to positive type" is prepared, a protective layer is preferably provided on the negative type photosensitive resin layer. The protective layer can be formed on the resin layer by coating a solution of polymer material such as polyvinyl alcohol, polyvinyl acetael, methyl vinyl ethermaleic anhydride copolymer, polyvinyl pyrrolidone, gelatin and gum arabic; and drying the coated solution.

The examples and the comparison examples of the present invention are given below, but these examples by no means restrict the invention.

EXAMPLE 1

A coating solution for the preparation of an intermediate layer having the following composition was prepared.

Coating solution for intermediate layer

| Alcohol-soluble polyamide (CM-8000, viscosity: 23 cps, available from Toray Corp., Japan) | 7.2 g. |
| Polyhydroxystyrene (Resin M, mean M.W.: 5,500, available from Maruzen Petroleum Co., Ltd. Japan) | 1.8 g. |
| Methanol | 400 g. |
| Methylcellosolve | 100 g. |

The above coating solution was coated uniformly over a polyethylene terephthalate film (support, thickness: 100 μm), and the coated solution was dried to give an intermediate layer having thickness of 0.5 μm (dry basis).

Subsequently a photosensitive resin layer of "negative to positive type" was prepared using the coating solution of the following composition.

Coating solution for photosensitive resin layer

| Benzyl methacrylate-methacrylic acid copolymer (molar ratio: 73/27, viscosity: 0.12) | 60 g. |
| Pentaerythritol tetraacrylate | 43.2 g. |
| Michlers' ketone | 2.4 g. |
| 2-(o-Chlorophenyl)-4,5-diphenyl-imidazole dimer | 2.5 g. |
| Pigment Red 57 | 5.2 g. |
| Poly-N-vinylbenzyl-N,N,N-tri-n-hexylammonium chloride | 1.6 g. |
| Methylcellosolve acetate | 560 g. |
| Methyl ethyl ketone | 280 g. |

Viscosity was an intrinsic viscosity at 25° C. in methyl ethyl ketone.

On the support having the intermediate layer was coated the coating solution for a photosensitive resin layer, and the coated layer was dried to prepare a photosensitive resin layer having thickness of 2.4 μm (dry basis).

A coating solution for the preparation of a protective layer having the following composition was prepared. The coating solution was coated on the photosensitive resin layer and dried to give a protective layer having thickness of 1.5 μm.

Coating solution for protective layer

| Polyvinyl alcohol (GL-05, available from Japan Synthetic Chemical Co., Ltd.) | 60 g. |
| Water | 970 g. |
| Methanol | 30 g. |

Thus, a photosensitive image-forming material consisting of a support, an intermediate layer, a photosensitive resin layer and a protective layer was obtained.

COMPARISON EXAMPLE 1

The procedure of Example 1 was repeated except that poly-N-vinylvenzyl-N,N,N-tri-n-hexylammonium chloride was not introduced into the coating solution for the preparation of a photosensitive resin layer, to prepare a photosensitive image-forming material.

EXAMPLE 2

The procedure of Example 1 was repeated except that the composition of the coating solution for the preparation of a photosensitive resin layer was replaced with the following composition, to prepare a photosensitive image-forming material.

Coating solution for photosensitive resin layer

| Benzyl methacrylate-methacrylic acid copolymer (molar ratio: 73/27, viscosity: 0.12) | 60 g. |
| Pentaerythritol tetraacrylate | 43.2 g. |
| Michlers' ketone | 2.4 g. |
| 2-(o-Chlorophenyl)-4,5-diphenyl-imidazole dimer | 2.5 g. |
| Pigment red 49 | 5.2 g. |
| Poly-N-vinylbenzyl-N,N,N-tri-n- | 4.8 g. |

| | | |
|---|---|---|
| hexyl ammonium chloride | | |
| Methylcellosolve acetate | 560 g. | |
| Methyl ethyl ketone | 280 g. | |

COMPARISON EXAMPLE 2

The procedure of Example 2 was repeated except that poly-N-vinylbenzyl-N,N,N-tri-n-hexyl ammonium chloride was not introduced into the coating solution for a photosensitive resin layer, to prepare a photosensitive image-forming material.

Evaluation of Photosensitive Image-forming Material

The photosensitive image-forming materials obtained in the above examples were evaluated on the color-fogging according to the following test.

Each of the photosensitive recording materials was combined with a corresponding mask and exposed imagewise to light from a ultra high-pressure mercury lamp (2 KW) at a distance of 50 cm away. The exposed photosensitive image-forming material was developed at 35° C. for 20 to 25 sec. in a developing solution having the following composition, to obtain a red-colored image on the material.

Composition of developing solution

| | | |
|---|---|---|
| $Na_2CO_3$ | 15 g. | |
| Butylcellosolve | 3 g. | |
| Water | 1 l | |

The photosensitive image-forming material having the red-colored image was observed with respect to stain of pigment on the non-colored area (intermediate layer) and evaluated according to the following classification.
A: Almost no stain of pigment was observed.
B: A little stain of pigment was observed.
C: Not a little stain of pigment was observed.
The results are set forth in Table 1.

TABLE 1

| | Pigment-fogging |
|---|---|
| Example 1 | A |
| Com. Example 1 | B |
| Example 2 | A |
| Com. Example 2 | C |

As is evident from the results set forth in Table 1, when a red-colored image was formed using the photosensitive image-forming materials of the present invention (Examples 1 and 2), stain on the non-image area (namely, pigment-fogging on the intermediate layer) was hardly observed, to give a sharp image. In contrast, when the photosensitive recording materials for comparison (Comparison Examples 1 and 2) were employed, pigment-fogging was observed on the non-image area thereof.

We claim:

1. In a photosensitive recording material comprising a support, an intermediate layer and a coated photopolymer-containing layer which comprises a photopolymer developable with an alkaline solution, a photosensitive agent selected from the group consisting of an azide-type photosensitive agent, Michler's Ketone and a quinonediazide-type photosensitive agent, and a pigment, wherein said pigment is a compound having the formula (I):

$$[A-N=N-B]^{n-} M^{n-} \quad (I)$$

wherein A is

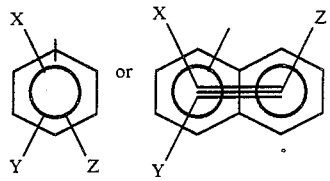

wherein each of X, Y and Z is any one of a carboxylic acid group, sulfonic acid group, an alkyl group having 1-12 carbon atoms, an alkoxyl group having 1-12 carbon atoms, a nitro group, a halogen atom and a hydrogen atom;

B is

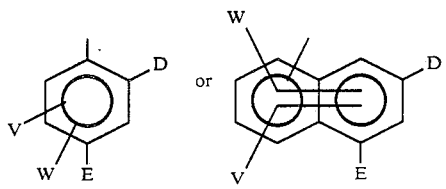

wherein each of V and W is any one of a caboxylic acid group, a sulfonic acid group, and a hydrogen atom; and each of D and E is a hydrogen atom or a hydroxyl group, and at least one of D and E is a hydroxyl group; and at least one of X, Y, Z, V and W is a carboxylic acid group or a sulfonic acid group;

M is a metal atom; and n is an integer of from 1–5; and said photopolymer containing layer contains a compound having the formula (II):

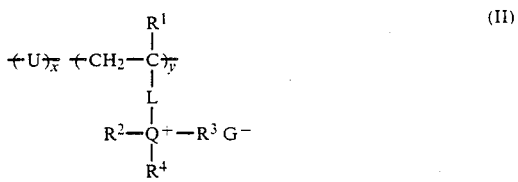

wherein U is an ethylenic unsaturated monomer; L is a divalent group having 1-12 carbon atoms; Q is a nitrogen atom or a phosphorous atom; $R^1$ is a hydrogen atom or an alkyl group having 1-6 carbon atoms; each of $R^2$, $R^3$ and $R^4$ independently is an alkyl group having 1-12 carbon atoms or an already group having 7-20 carbon atoms; $G^-$ is a monovalent anion; x is number in the range of 0-90 molar %; and Y is a number in the range of 10-100 molar %;

said pigment of the formula (I) being contained in the photopolymer containing layer in an amount within the range of 1-30% by weigh based on the solid component of the photopolymer containing layer and said compound of the formula (II) and said pigment of the formula (I) being contained in the photopolymer containing layer in a weight ratio of from 1:99 to 70:30.

2. The photosensitive recording material as claimed in claim 1 wherein the pigment of the formula (I) is contained in the photopolymer containing layer in an amount within the range of 2-10 by weight based on the solid component of the photopolymer containing layer.

3. The photosensitve recording material as claimed in claim 1, wherein the compound of the formula (II) and the pigment of the formula (I) are contained in the photopolymer containing layer in a weight ratio of from 15:85 to 50:50.

* * * * *